United States Patent
Alvarez

(10) Patent No.: US 6,732,913 B2
(45) Date of Patent: May 11, 2004

(54) METHOD FOR FORMING A WAFER LEVEL CHIP SCALE PACKAGE, AND PACKAGE FORMED THEREBY

(75) Inventor: Romeo Emmanuel P. Alvarez, Singapore (SG)

(73) Assignee: Advanpack Solutions Pte Ltd., Singapore (SG)

( * ) Notice: Subject to any disclaimer, the term of this patent is extended or adjusted under 35 U.S.C. 154(b) by 0 days.

(21) Appl. No.: 10/315,534

(22) Filed: Dec. 10, 2002

(65) Prior Publication Data

US 2003/0127502 A1 Jul. 10, 2003

Related U.S. Application Data

(63) Continuation-in-part of application No. 09/843,248, filed on Apr. 26, 2001, now Pat. No. 6,592,019.

(30) Foreign Application Priority Data

Dec. 10, 2001 (SG) .......................................... 200107810

(51) Int. Cl.⁷ ............................................... B23K 35/14
(52) U.S. Cl. ..................................................... 228/246
(58) Field of Search ........................... 228/246, 180.22, 228/123.1, 254, 193–195, 56.3; 428/403, 209, 643, 644, 570; 148/24; 106/286.2, 287.19; 438/613–617; 257/737, 738

(56) References Cited

U.S. PATENT DOCUMENTS

| 6,015,505 A | * | 1/2000 | David et al. ................ 252/79.2 |
| 6,072,236 A | | 6/2000 | Akram et al. ................ 257/698 |
| 6,105,851 A | * | 8/2000 | Norell et al. ................ 228/245 |
| 6,196,443 B1 | * | 3/2001 | DiGiacomo ............ 228/180.22 |
| 6,369,451 B2 | * | 4/2002 | Lin ............................. 257/779 |
| 6,468,892 B1 | | 10/2002 | Baker et al. ................ 438/612 |

OTHER PUBLICATIONS

U.S. patent application Pub. US 2002/0027257 A1 to Kinsman et al., "Method for Fabricating a Chip Scale Package Using Wafer Level Processing and Devices Resulting Therefrom", pub Mar. 7, 2002.

U.S. patent application Ser. No. 09/564,382 to Francisca Tung, filed Apr. 27, 2000, "Improved Pillar Connections for Semiconductor Chips & Method of Manufacture".

Continuation–In–Part U.S. patent application Ser. No. 09/843,248 to Francisca Tung, filed Apr. 26, 2001, "Improved Pillar Connections for Semiconductor Chips and Method of Manufacture", assigned to a common assignee.

* cited by examiner

*Primary Examiner*—Kiley Stoner
*Assistant Examiner*—Jonathan Johnson
(74) *Attorney, Agent, or Firm*—George O. Saile; Stephen B. Ackerman

(57) ABSTRACT

A method for fabricating a chip scale package is described. The method utilizes wafer level processes to obtain a chip level package. The method particularly avoids the use of mechanical grinding by the novel use of molding, extruding, and etching technology.

40 Claims, 12 Drawing Sheets

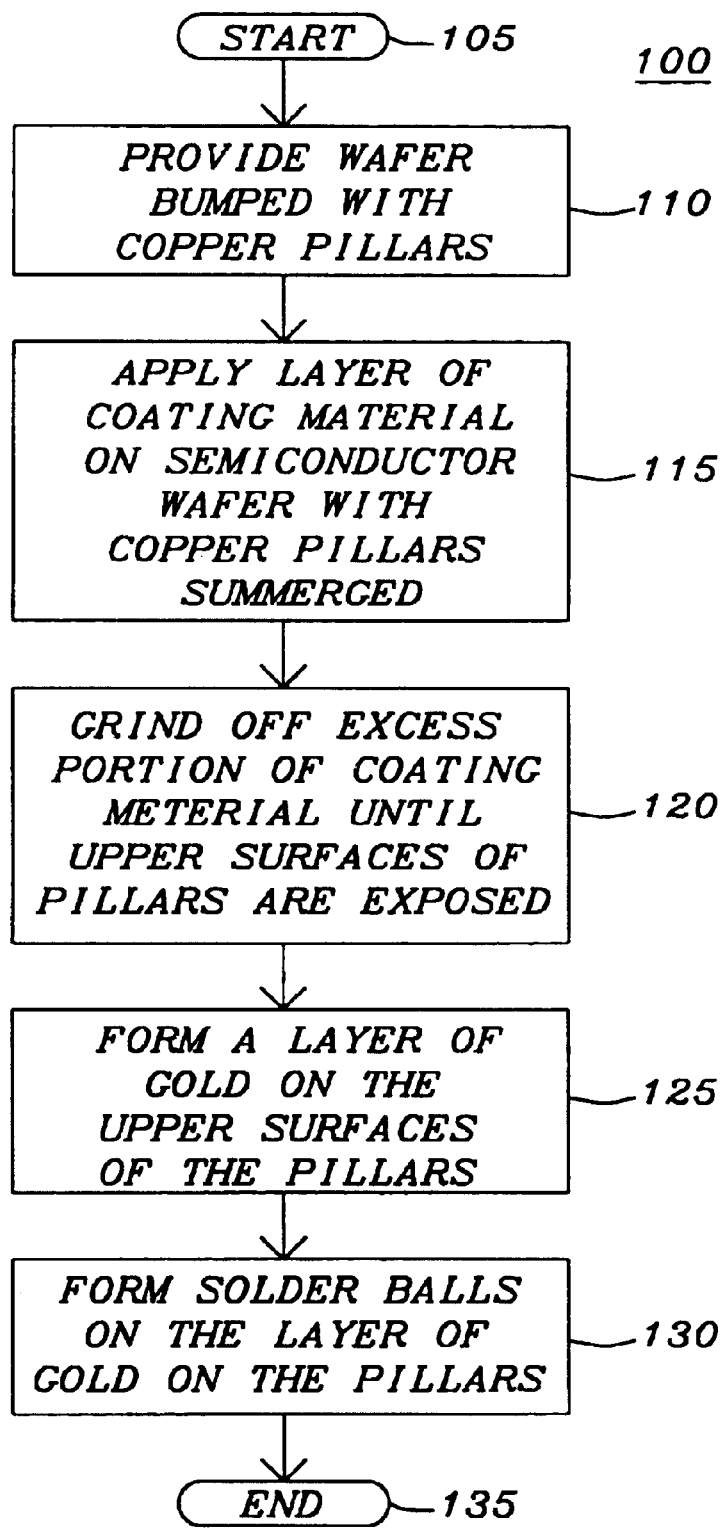
FIG. 1 - Prior Art

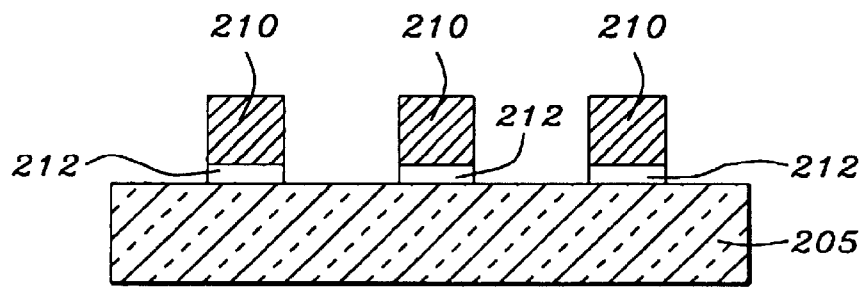
FIG. 2A – Prior Art
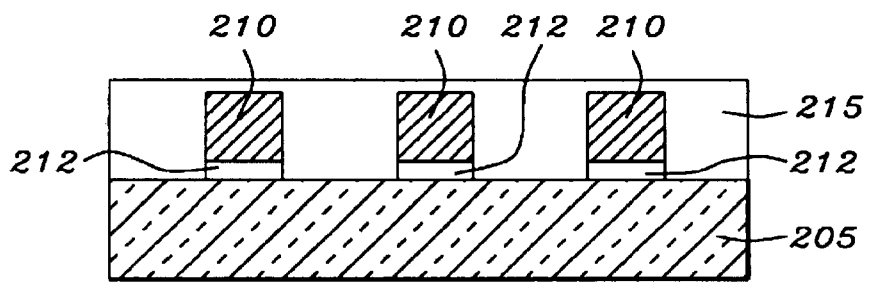
FIG. 2B – Prior Art
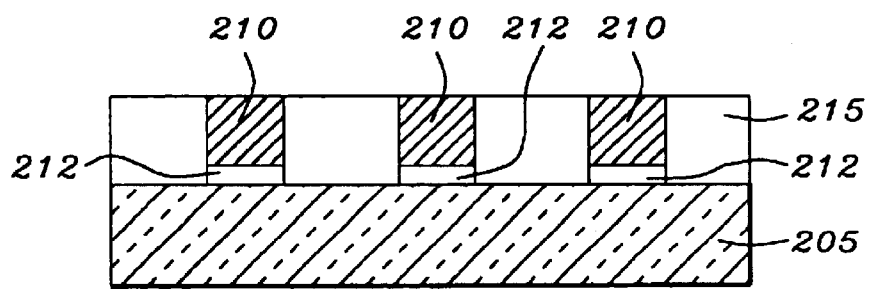
FIG. 2C – Prior Art

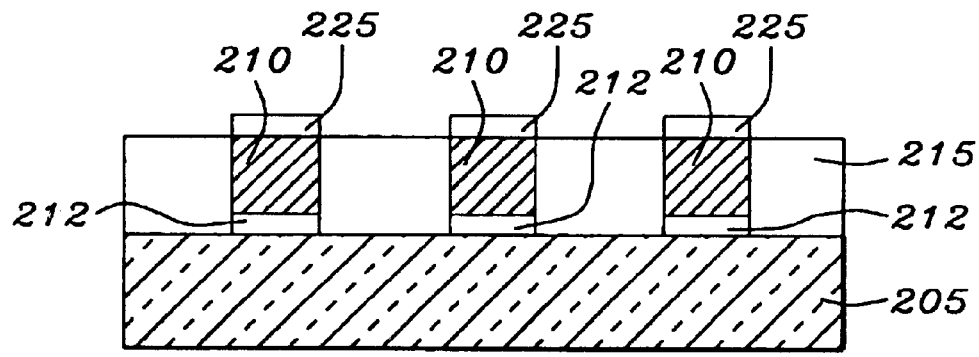
FIG. 2D – Prior Art
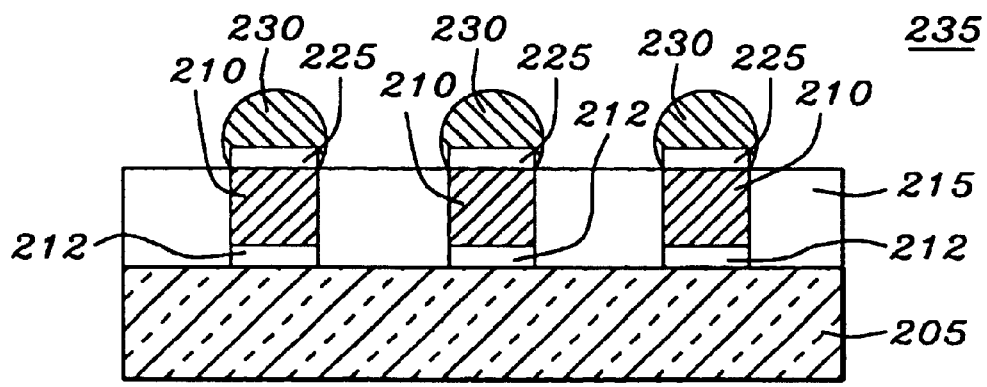
FIG. 2E – Prior Art

METHOD FOR FORMING A WAFER LEVEL CHIP SCALE PACKAGE, AND PACKAGE FORMED THEREBY

RELATED PATENT APPLICATION

This application is related to U.S. patent application Ser. No. 09/564,382 by Francisca Tung filed on Apr. 27, 2000, and Continuation-In-Part U.S. patent application Ser. No. 09/843,248 by Francisca Tung filed on Apr. 26, 2001 now U.S. Pat. No. 6,592,019, and assigned to a common assignee as the present invention.

FIELD OF THE INVENTION

The present invention relates to forming a wafer level chip scale package, and more particularly to forming a wafer level chip scale package that avoids mechanical grinding in the fabrication process.

BACKGROUND OF THE INVENTION

The following two U.S. patents and U.S. patent publication relate in general to the methods of fabrication of chip level packages utilizing wafer level fabrication methods.

U.S. Pat. No. 6,072,236 dated Jun. 6, 2000, issued to S. Akram et al. discloses a wafer level process utilizing micro-machining to fabricated chip scale packages.

U.S. Pat. No. 6,468,892B1 dated Oct. 22, 2002, issued to M. H. Baker et al. describes a method utilizing a solder mask at the wafer level for forming bumps on chip scale packages.

U.S. Patent Application Publication US2002/002725A1 dated Mar. 7, 2002, issued to L. D. Kinsman et al. describes a method for fabricating a chip scale package utilizing wafer level processing.

With a need for smaller semiconductor packages, there are now processes for packaging of semiconductor integrated circuits, or dies, at the wafer level. Such processes are commonly and collectively referred to as wafer level chip scale packaging, and the resultant package is referred to as a wafer level chip scale package, (WL-CSP).

With reference to FIGS. 1 and 2A–E, an example of a wafer level chip scale packaging process 100 is now described. After components, circuitry and pads have been fabricated on a wafer 205 by processes, as will be known to one skilled in the art, the packaging process 100 starts 105 with providing 110 the wafer 205 with metal pillars 210 formed on the die pads 212, or under bump material. FIG. 2A shows the wafer 205 with the metal pillars 210 formed on the die pads 212.

U.S. patent application Ser. No. 09/564,382 by Francisca Tung, filed on Apr. 27, 2000, titled "Improved Pillar Connections for Semiconductor Chips and Method of Manufacture", and Continuation-In-Part U.S. patent application Ser. No. 09/843,248 by Francisca Tung filed on Apr. 26, 2001, titled "Improved Pillar Connections for Semiconductor Chips and Method of Manufacture", and assigned to a common assignee as this patent application, teaches forming at least some of such pillar structures as described herein. These patent applications are incorporated herein by reference.

A layer of coating material 215 such as mold compound, encapsulant epoxy, such as underfill coating material, or photo imageable material, such as benzocyclobutene (BCB) or polyimide, is then applied 115 over the wafer 205 with the metal pillars 210 covered by the coating material 215, as shown in FIG. 2B. The layer of coating material 215 is applied with a spin coating process. Typically, two layers of material each with a thickness of about 40–50 micrometers or microns (um) are applied to produce the resulting layer of coating material 215 with a thickness of about 100 um. The coating material should be no more than 10 um thick on the copper pillars 210, and the layer of coating material 213 is then cured.

After curing, the excess coating material on the copper pillars 210 is ground 120 away using mechanical grinding, employing abrasive compounds on grinding machines, by Okamoto Corporation of USA or Kemet International Limited of the UK, and using a poromeric polishing pad. Grinding 120 continues until the excess coating material is removed and the upper surfaces 220 of the copper pillars 210 are exposed. The ground wafer is shown in FIG. 2C.

Next a layer of gold 225 is formed 125 on the upper surfaces 220 by, for example, electroplating, as shown in FIG. 2D; and solder balls 230 are attached 130 to the layer of gold 225. Equipment by manufacturers including OKI, Casio, Fujitsu, all of Japan can be used to attach the solder balls. It will be appreciated by those skilled in the art that a subsequent reflow process causes the solder balls 230 to melt and adhere to the layer of gold 225. The wafer level packaging process 100 then ends 135. After the process 100, the bumped wafer 235 is diced to singulate the WL-CSPs.

During the grinding step 120, the wafer 205 is subjected to severe mechanical stress, and can result in micro-cracks in the wafer. Hence, a disadvantage of the process of making WL-CSPs using mechanical grinding is the potential of adverse reliability caused by micro-cracks. Another disadvantage of mechanical grinding is that grinding is slow. Yet another disadvantage is the need to invest in grinding equipment and an associated supply of grinding consumables.

Since only the upper surfaces of the layer of gold are exposed, the surface area of the gold layer to which the solder balls 230 can adhere is limited. Hence, another disadvantage is the limited surface area of the layer of gold to which the solder balls can adhere, as this can adversely affect the reliability of the WL-CSP.

The spin coating process is slow, and in addition, two spin coating operations are required to obtain a coating with the required thickness. In addition, the spin coating process wastes approximately 85% of the coating material that is disposed on the wafer 205. Therefore, still another disadvantage of the process described is the use of spin coating, which is both slow and expensive.

BRIEF SUMMARY OF THE INVENTION

The present invention seeks to provide a method for forming a wafer level chip scale package and a package formed thereby, which overcomes or at least reduces the abovementioned problems of the prior art.

Accordingly, in one aspect, the present invention provides a method for forming a wafer level chip scale semiconductor package, the method comprising the steps of:
  providing a semiconductor wafer having a surface with a plurality of pads, wherein each of the pads has a conductor extending a first predetermined distance away from the surface;
  forming a layer of conductive etch resistant material on free ends of the conductors;
  disposing electrically insulating material on the surface of the semiconductor wafer, wherein the layer of electrically insulating material has an exposed surface a second predetermined distance from the surface of the semiconductor wafer, wherein the second predetermined distance is less than the first predetermined distance, and wherein portions of the electrically insulating material are disposed on the layer of conductive etch resistant material and on side surfaces of at least some of the conductors; and removing substantially all the portions of the electrically insulating material disposed on the layer of conductive etch resistant material and on the side surfaces of some of the conductors.

In another aspect, the present invention provides a wafer level chip scale package comprising:

a semiconductor die having a plurality of pads on a surface;

conductors coupled to and extending a first predetermined distance from the plurality of pads;

an etch resistant layer on free ends of the conductors;

a layer of insulation on the surface, the layer of insulation having an exposed surface a second predetermined distance from the surface, wherein the second predetermined distance is less than the first predetermined distance; and reflowable material adhering to the etch resistant layer and to at least portions of side surfaces of substantially all of the conductors.

In yet another aspect the present invention provides a method for forming a wafer level chip scale semiconductor package, the method comprising the steps of:

providing a semiconductor wafer having a surface with a plurality of pads, wherein each of the pads has a conductor extending a first predetermined distance away from the surface;

disposing reflowable material on free ends of the conductors;

disposing electrically insulating material on the surface of the semiconductor wafer, wherein the layer of electrically insulating material has an exposed surface a second predetermined distance from the surface of the semiconductor wafer, wherein the second predetermined distance is greater than the first predetermined distance; and selectively removing at least a portion of the electrically insulating material such that the exposed surface is a third predetermined distance from the semiconductor wafer, wherein the third predetermined distance is greater than the first predetermined distance and less than the second predetermined distance.

In still another aspect the present invention provides a wafer level chip scale package comprising:

a semiconductor die having a plurality of pads on a surface;

conductors coupled to and extending a first predetermined distance from the surface of the semiconductor die;

reflowable material attached to the free ends of the conductors; and a layer of insulation on the surface of the semiconductor die and surrounding the conductors, the layer of insulation having an exposed surface a second predetermined distance from the surface of the semiconductor die, wherein the second predetermined distance is greater than the first predetermined distance.

BRIEF DESCRIPTION OF THE DRAWINGS

An embodiment of the present invention will now be fully described, by way of example with reference to the drawings of which:

FIG. 1 shows a flowchart detailing a process for forming a WL-CSP in accordance with the prior art;

FIGS. 2A–E show cross-sectional views of the WL-CSP being formed in accordance with the process in FIG. 1;

DETAILED DESCRIPTION OF THE PREFERRED EMBODIMENT

A layer of gold is disposed on upper surfaces of copper pillars on a wafer. Coating material is then applied on the wafer with an extrusion process, where the coating material forms a layer at a lower level relative to the height of the copper pillars, leaving the copper pillars protruding above the upper surface of the coating material. Etchant is disposed to remove the portions of coating material on the layer of gold and the portions of coating material adhering to side surfaces of the protruding copper pillars. Solder deposits are then disposed on the layer of gold on the copper pillars, and the assembly is reflowed. The solder deposits form balls on the layer of gold on the copper pillars, with the copper pillars protruding into the solder balls. Hence, the solder balls adhere to the layer of gold and in addition, the solder balls advantageously also adhere to the side surface of the copper pillars.

Figure 3:
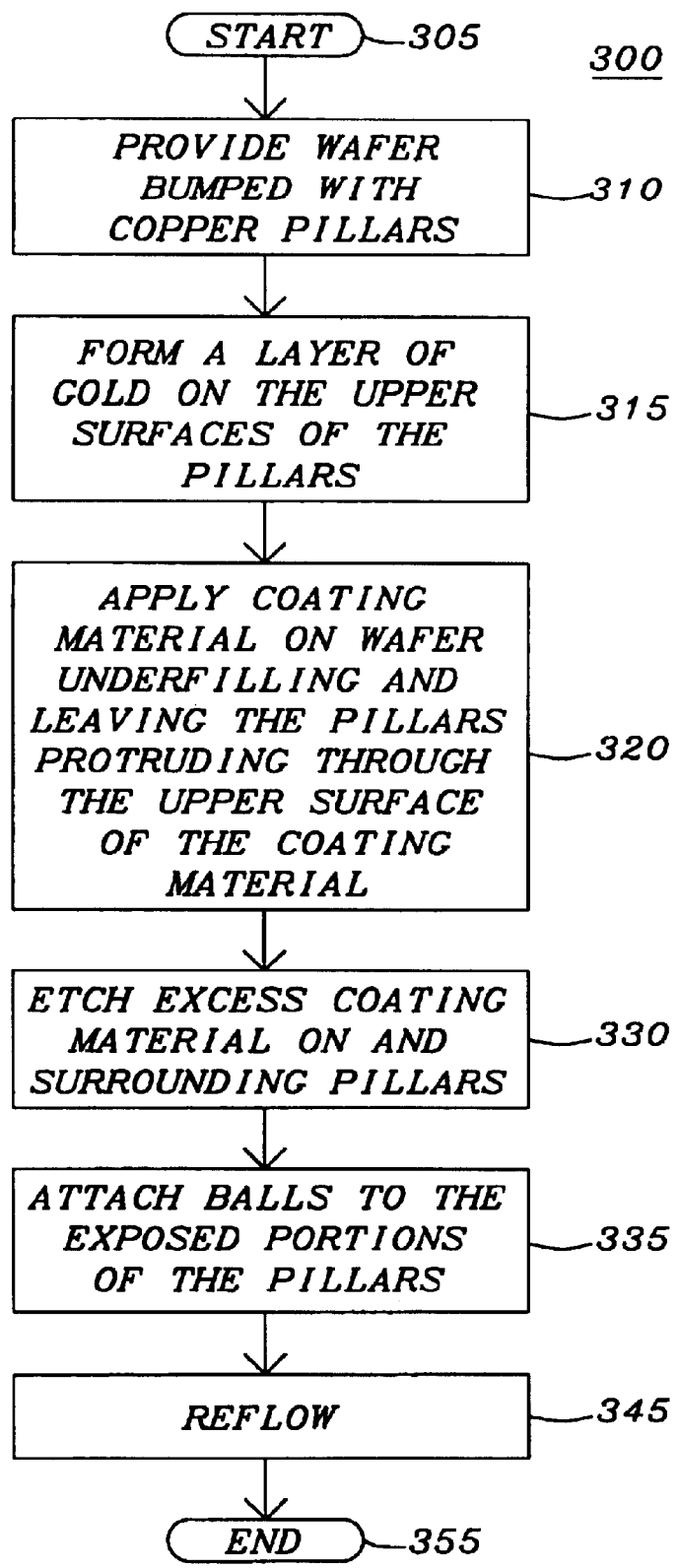
FIG. 3 shows a flowchart detailing a process for forming a WL-CSP in accordance with the present invention.
Figure 4A:
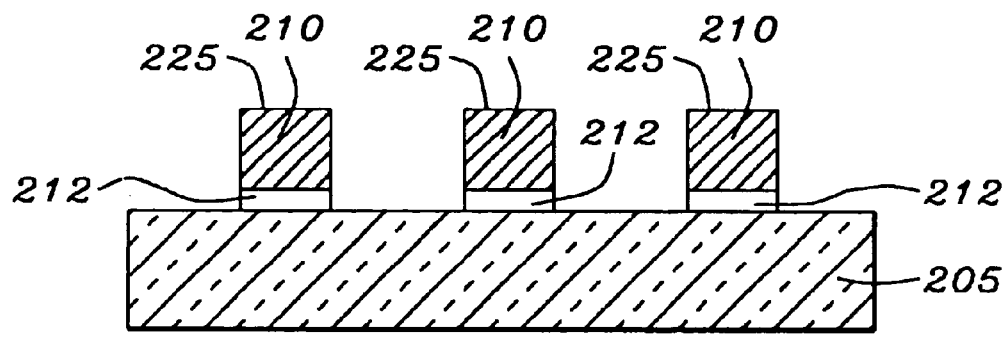
FIGS. 4A–E show cross-sectional views of the WL-CSP being formed in accordance with the process in FIG. 3.

With reference to FIG. 3 and FIGS. 4A–E, a process 300 of forming a WL-CSP in accordance with the present invention, starts 305 with providing 310 a semiconductor wafer 205 with copper pillars 210 extending from die pads 212 on the semiconductor wafer 205, as shown in FIG. 4A. As mentioned earlier, U.S. patent application Ser. No. 09/564,382 by Francisca Tung, filed on Apr. 27, 2000, titled "Improved Pillar Connections for Semiconductor Chips and Method of Manufacture:, and Continuation-In-Part U.S. patent application Ser. No. 09/843,248 by Francisca Tung, filed on Apr. 26, 2001, titled "Improved Pillar Connections for Semiconductor Chips and Method of Manufacture", and assigned to a common assignee as the present patent application, teaches forming at least some of such pillar structures as described herein. These patent applications are incorporated herein by reference.

Figure 4B:
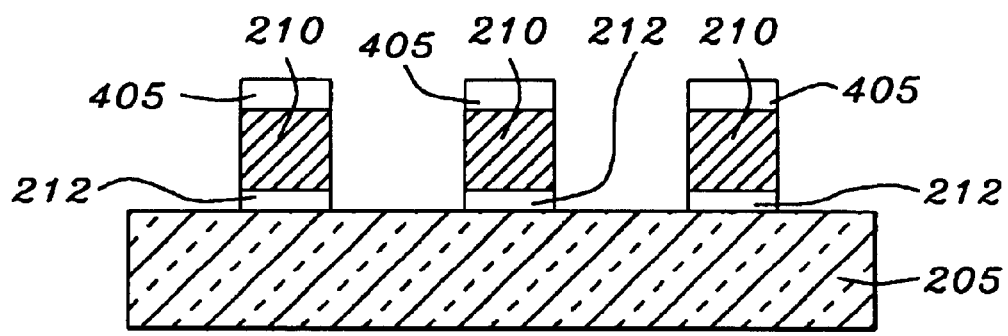

A layer of gold 405 is then formed 315 on the upper surfaces 225 of the copper pillars 210, as shown in FIG. 4B. The layer of gold 405 is often referred to as gold flash, and can be formed using deposition, as will be known to one skilled in the art. The layer of gold provides a conductive etch resistant layer to prevent the copper pillars from being etched by etchant in a subsequent etching process.

Alternatively, a layer of nickel can be first formed on the upper surfaces 225 of the copper pillars 210, and a layer of gold formed on the layer of nickel. The layer of nickel forms a barrier to prevent diffusion of gold into the copper, in the event the etching process removes portions of the layer of gold and/or diffusion of the gold into the copper pillars 210, leaves the copper pillars 210 exposed. When the layer of nickel is used, then the reference "405" in the drawings refers to the two layers of nickel and gold forming a conductive etch resistant layer. Yet another alternative is forming a layer of solder on the upper surfaces 225 of the copper pillars 210, where the layer of solder provides a conductive etch resistant layer to prevent the copper pillars 210 from being etched by etchant in the subsequent etching process. In addition, the layer of solder advantageously enhances the wetting angle when subsequently attaching solder balls to the layer of solder on the copper pillars 210.

Figure 4C:
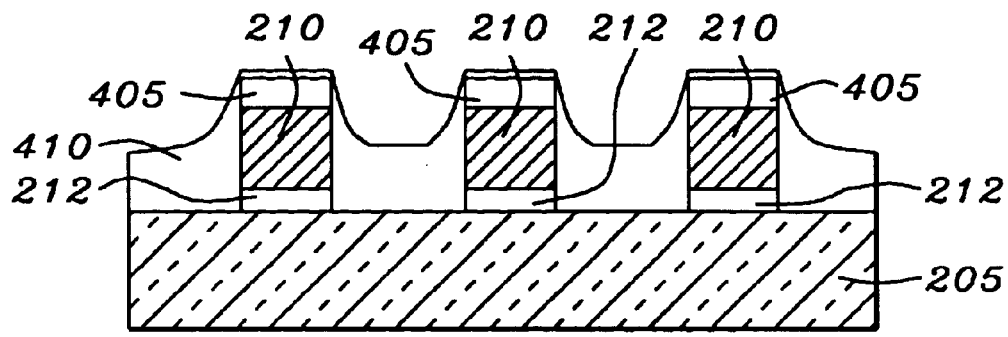

Next, with reference to FIG. 4C, coating material is applied 320 in fluid form on the semiconductor wafer 205 to form a layer of coating 410 which has an upper surface which is lower relative to the height of the copper pillars 210. Consequently, the copper pillars 210 with the layer of gold 405 protrudes away from the layer of coating material 410. Ideally, the layer of coating material 410 is lower by 20–30 um. The layer of coating material 410 is formed using an extrusion process. This is accomplished with equipment such as MicroE from FAS Technologies of Dallas, Tex., USA. The coating material used can also comprise APS epoxy Wafer Coating Underfill (WCU), Dexter's underfill epoxy or any photo imageable coating material. With the MicroE extrusion coating equipment and the APS WCU epoxy, the equipment settings include POH rate 115 microliters (ul) per second, shuttle velocity 2.5 millimeter (mm), coating gap 125 um, and extrusion head shim of 0.2 mm.

With the extrusion coating process 80–90% of the coating material that is dispensed forms the layer of coating 410, and a single dispense can produce the layer of coating 410 with the required thickness. In addition, the extrusion coating process can dispense the coating material having a desired thickness to a tolerance of 2%. Extrusion coating is typically employed in the production of flat panel displays.

Hence, the present invention as described, advantageously forms a layer of coating material on a semiconductor wafer more quickly and with less wastage than the spin coating process, and with the required thickness with a single application.

The layer of coating 410 can also be formed using known spin coating processes, however, the spin coating process must be controlled to produce the layer of coating 410 having a predetermined thickness. For example, the quantity of coating material that is disposed on the semiconductor wafer 205, the type of coating material used, and the speed and duration at which the semiconductor wafer 205 is spun, can be selected to produce the layer of coating material 410 having the desired thickness An example is a Spin Coater machine by SITE of the USA, which applies a coating of BCB or polyimide or epoxy based coating material. The setting for the spin coating machine includes first coating speed of 1500 revolutions per minute (rpm) for a period of 30 seconds; and second coating speed of 1800 rpm for 20 seconds, to coat 30–40 um layer of coating material.

Another method forming the layer of coating 410 is using a molding process in conjunction with a Teflon® film, similar to that taught in U.S. Pat. No. 5,891,384 assigned to Apic Yamada Corporation of Japan, which is incorporated by reference.

After applying the layer of coating material 410, the semiconductor wafer is then heated to cure the layer of coating 410. The heat is applied at a temperature of 350° C. for 45 to 60 minutes in a nitrogen (N2) environment. Typically, an oven with a controlled nitrogen chamber is used for curing.

Figure 5:
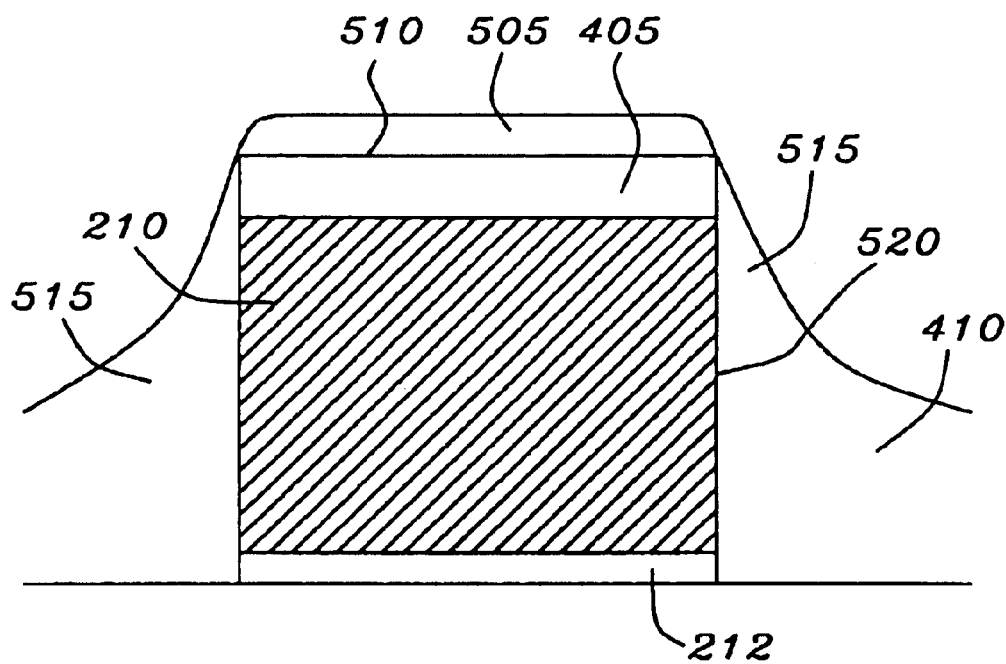
FIGS. 5–7 show enlarged cross-sectional views of a portion of the WL-CSP being formed in FIGS. 4C–E.

FIG. 5 shows an enlarged sectional view of one of the copper pillars 210 with the layer of gold 405, after the layer of coating 410 has been formed. Portions 505 of the cured layer of coating material 410 adhere to the upper surface 510 of the gold layer 405, and portions 515 of the cured coating material 410 adhere to side surfaces 520 of the copper pillars 210.

Figure 4D:
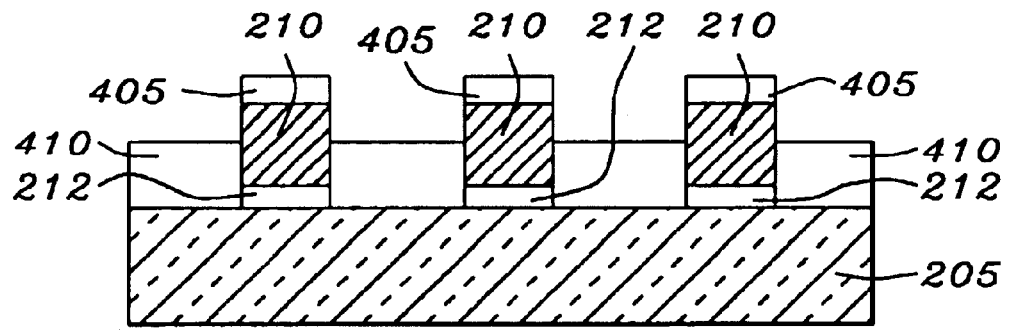
Figure 6:
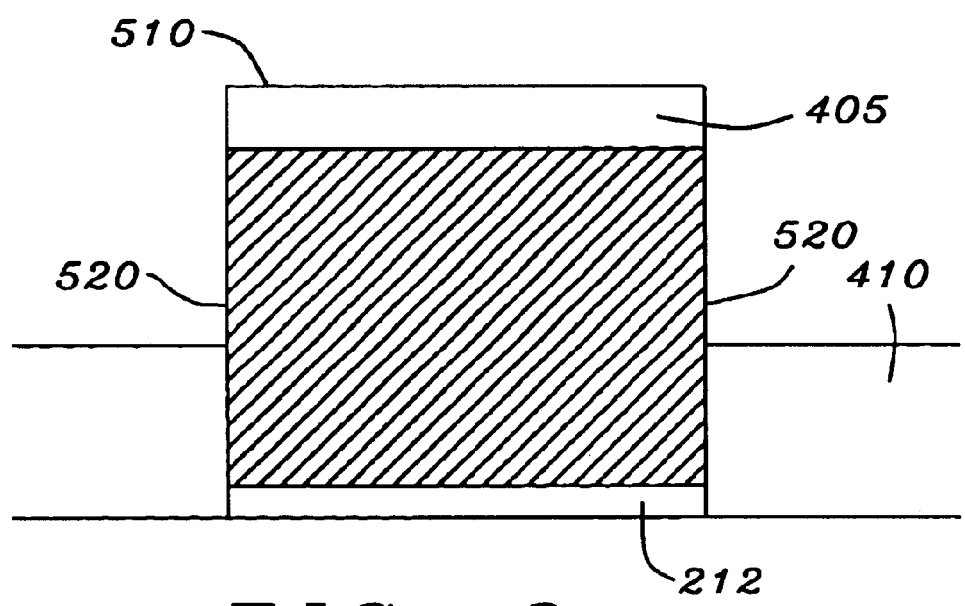

Subsequently, etchant is applied to the coated surface of the semiconductor wafer 205 to etch 330 away the portions 505 and 515 of the cured layer of coating material 410 on the gold layers 405 and on the side surfaces 505 of the copper pillars 210. FIG. 4D shows the semiconductor wafer 205 after etching, and FIG. 6 shows an enlarged side sectional view of one of the copper pillars 210 with the layer of gold, with the portions 505 and 515 of the cured layer of coating material 410 on the gold layers 405 and on the side surfaces 505 of the copper pillars 210, are etched away.

When plasma etching is employed the plasma etchant comprises a gas composition of 5% $CF_4$ 90% $O_2$, 5% Ar, with a power setting of 400 watts for a duration of 15 minutes. Alternatively, deflashing equipment such as laser deflashers or media deflashers, that are typically used for leadframe and mold deflashing, may be adapted and used to remove the portions 505 and 515 of the cured layer of coating material 410 on the gold layers 405 and on the side surfaces 505 of the copper pillars 210. An example of a media deflasher is that manufactured by Fujiseiki of Japan.

The present invention advantageously forms a layer of coating material having relatively smaller portions that need to be removed, thus allowing etching to be used and avoiding the need for mechanical grinding.

Figure 4E:
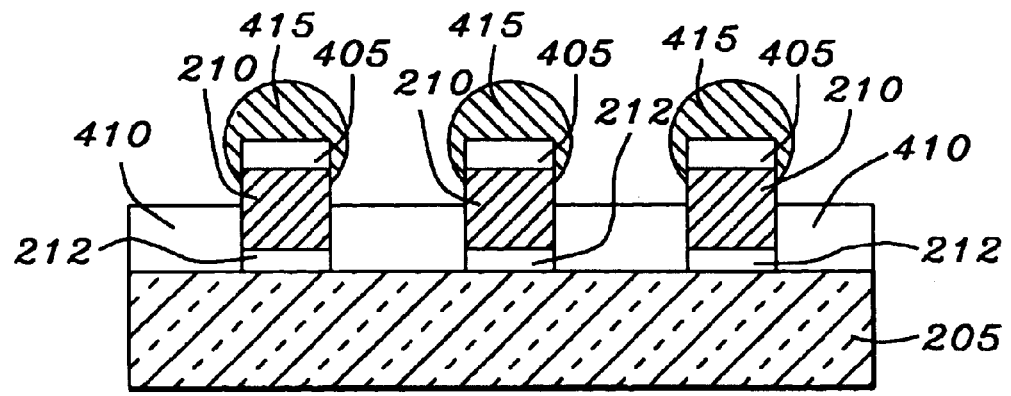

With reference to FIG. 4E, after etching 330, solder balls attached to the copper pillars 210, and the semiconductor wafer 205 is reflowed 345. The process 300 then ends 355.

Figure 7:
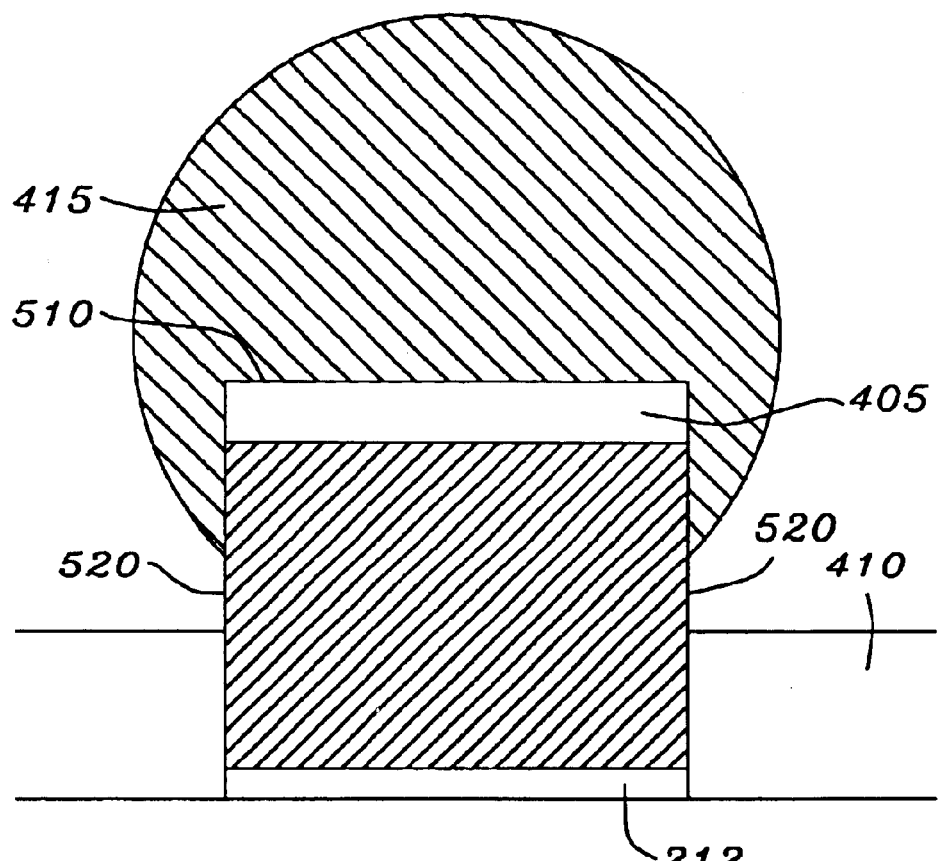

FIG. 7 shows an enlarged sectional view of one of the solder balls 415 attached to the copper pillars 210 after reflow. The copper pillar 210 with the layer of gold 405 protrudes into the solder ball 415, and the solder adheres to the surface 510 of the layer of gold 405. In addition, the solder adheres to the side surfaces 520 of the copper pillar 210.

The present invention, as described, advantageously allows solder to adhere to the layer of gold and the side surfaces of the copper pillar resulting in a stronger mechanical joint and a more reliable electrical connection.

Figure 8:
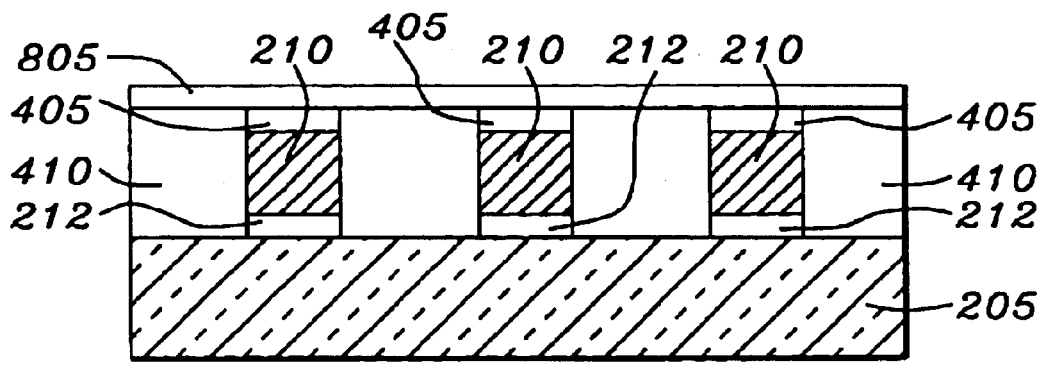
FIG. 8 shows a cross-sectional view of film placed on the semiconductor wafer as part of enhancing the process in FIG. 3.
Figure 9:
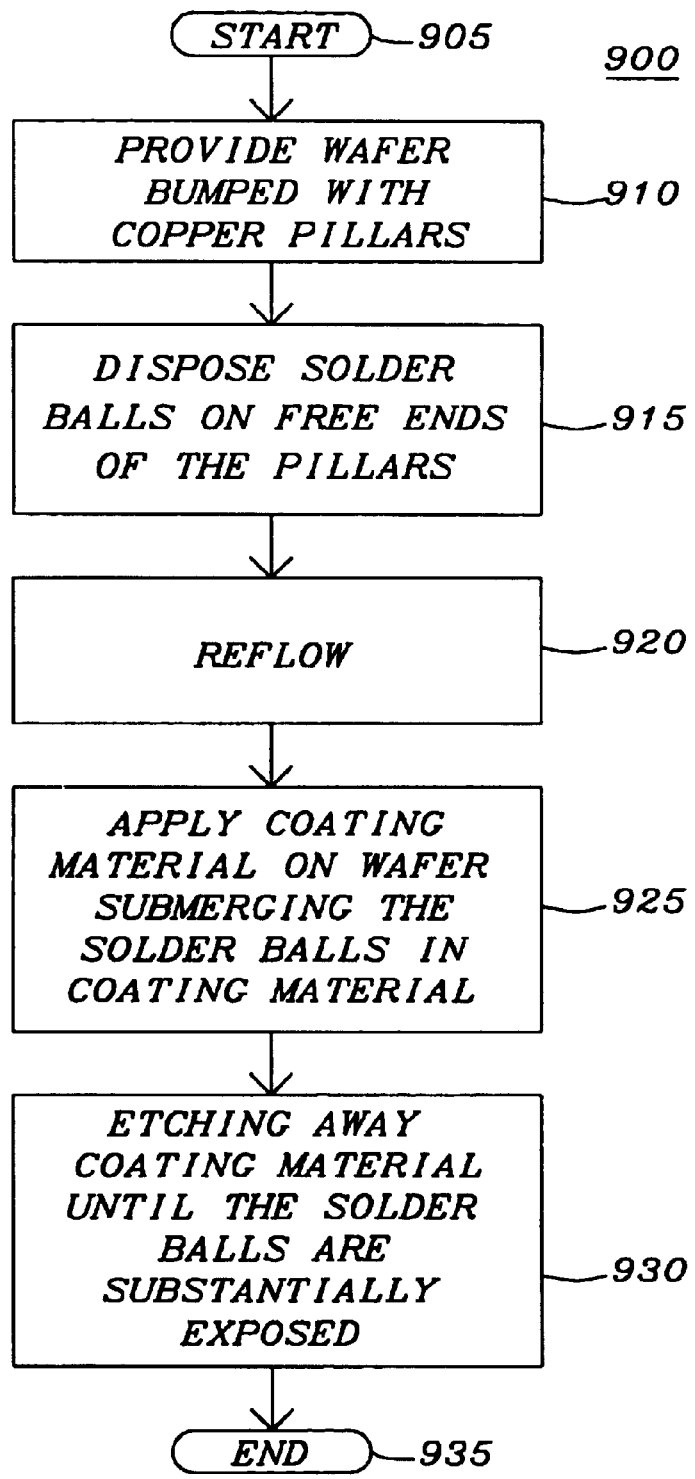
FIG. 9 shows a flowchart detailing an alternate process for forming a WL-CSP in accordance with the present invention.

With reference to FIG. 8 an additional cleaning step can be used prior to etching 330 to enhance the efficiency of the etching process. After applying 320 the coating material 410 on the semiconductor wafer 205, but prior to curing the coating material 410, Teflon® film 805 is placed over the semiconductor wafer 210, and pressure applied to force the Teflon® film against the semiconductor wafer 210. The Teflon® film 805 is then removed, taking with it the uncured portions 505 of the coating material on the upper surfaces 510 of the layer of gold 405. Subsequently, this leaves less of the cured portions 505 and 515 of the coating material that need to be removed by the etching process 330.

Teflon® film is also known as release film, which is more commonly used in molding. When the layer of coating is formed by a molding process in conjunction with release film, the release film prevents the mold compound from getting on the surface 510 of the layer of gold 405 and also on the side surfaces 520 of the copper pillar 210, during the molding process. Examples of release film that can be used to add cleaning uncured portions of coating material is release film by 3M of the USA. The release film can be applied manually.

Alternatively, laser cleaning can be employed to clean away the uncured portions of coating material on the layer of gold 405. Laser cleaning is known to one skilled in the art, and an example of laser cleaning equipment that may be utilized is that manufactured by Advanced Systems Automation Limited (ASA) of Singapore.

As is known, the precision of an etching process is dependent on a variety of process parameters that include: the particular etching process employed; the etchant used; the coating material to be etched; the amount of coating material to be etched; etc. When etching a layer of coating material having a thickness of 10 microns, an etching process having a precision of much less than 10 microns is required. A figure of merit is defined as follows:

(Target thickness of layer to be etched)/(Precision of etching process) which for a reliable result must be >>1.

For example, with a target thickness of 10 microns and where an etching process having a precision of 5 microns is employed, the figure of merit yields 2. In contrast, when an alternative etching process having a precision of 2 microns is employed, the figure of merit is 5. Clearly the latter etching process is more desirable.

When an etching process having a precision of 50 microns is employed, with the target thickness of 10 microns, the figure of merit is <<1. Here, there is the risk of the etchant completely removing the layer of coating material from the surface of the semiconductor die 205. Hence, when an etching process having a precision of 50 microns is employed, an alternate embodiment of the present invention, as will be described below can be used.

In accordance with the alternate embodiment, a layer of gold is disposed on upper surfaces of copper pillars on a wafer, and solder balls attached to the layer of gold on the copper pillars, and the assembly reflowed. Coating material is then applied on the wafer with an extrusion process until the solder balls are submerged in coating material. After the coating material is cured, etchant is then disposed to remove a portion of the layer of coating material, such that the solder balls are substantially exposed. Due to the large amount of coating material that needs to be removed by etching, an etching process with reduced precision can advantageously be employed. For example, with a solder ball diameter of 300 microns, the target thickness is set to 250 microns, and with an etching process having a reduced precision of 50 microns, the figure of merit >>1. Thus, an etching process having a reduced precision can advantageously be employed, without adversely affecting the reliability of the resultant WL-CSP.

Figure 10A:
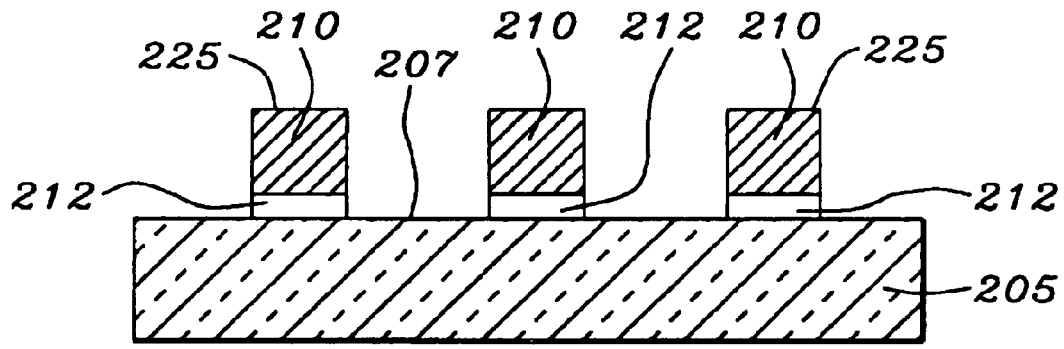
FIGS. 10A–D show cross-sectional views of a WL-CSP being formed in accordance with the process in FIG. 9.
Figure 10B:
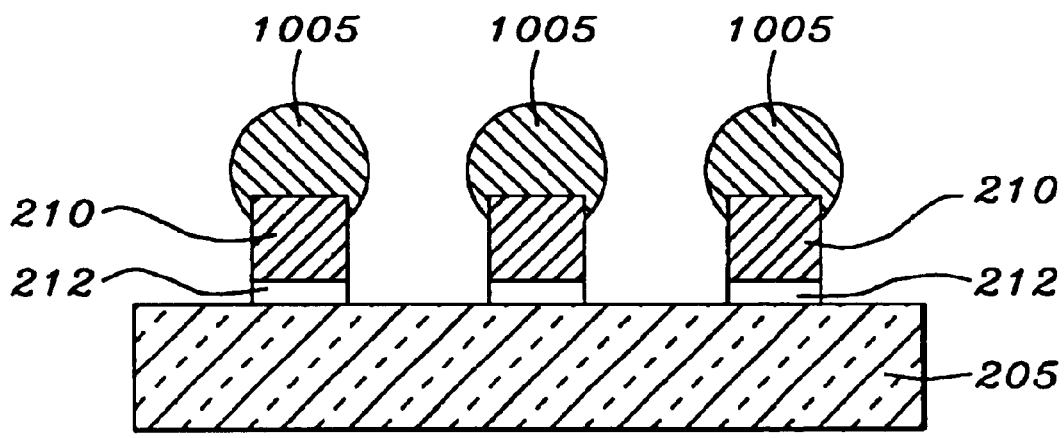

With reference to FIG. 9 and FIGS. 10A–D, a process 900, in accordance with the alternate embodiment of the present invention, starts 905 with providing 910 a semiconductor wafer 205 with copper pillars 210 extending from die pads 212 on the semiconductor wafer 205, as shown in FIG. 10A. References were provided earlier as to the formation of the pillars on the semiconductor wafer 205, and the same references apply here. Solder balls 1005, are then disposed 915 on the free ends of the copper pillars 210, and after a reflow process 920, the solder balls 1005 adhere to the copper pillars 210, as shown in FIG. 10B.

For proper adhesion and reliable coupling between the solder balls 1005 and the copper pillars 210, as is known, it is important that the surface of the copper pillars 210 do not have a layer of oxide thereon, prior to attaching the solder balls 1005 thereto. As copper tends to oxidize relatively quickly when exposed to ambient air, one method of providing a suitable surface for the solder is to dispose a layer of gold on the upper surface 225 of the copper pillars 210 prior to attaching the solder balls 1005. The layer of gold is often referred to as gold flash, and can be formed using deposition, as will be known to one skilled in the art. As gold is not as prone to oxidation as copper, the layer of gold provides an oxide free surface for the solder balls to adhere to.

Alternatively, a layer of solder can be formed on the upper surface 225 of the copper pillars 210 prior to attaching the solder balls 1005. In addition, the layer of solder provides a surface for solder balls to adhere to, and advantageously enhances the wetting angle when subsequently attaching solder balls to the layer of solder on the copper pillars 210.

Figure 10C:
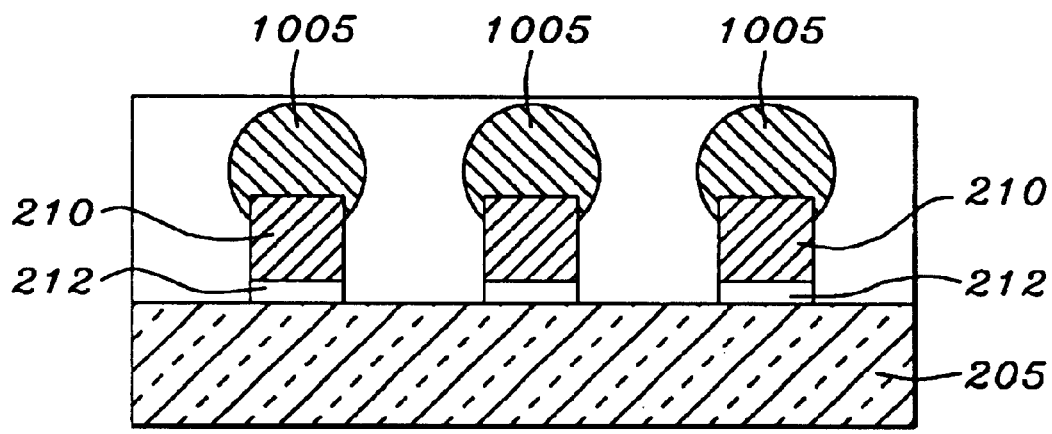

Next, with reference to FIG. 10C, coating material is applied 925 in fluid form on the semiconductor wafer 205 to form a layer of coating 1010 having a predetermined thickness, such that the solder balls 1005 are submerged in the layer of coating material 1010. The layer of coating material 1010 is applied using an extrusion coating process followed by curing. This can be accomplished with equipment such as MicroE from FAS Technologies of Dallas, Tex., USA. The coating material used is APS epoxy Wafer Coating Underfill (WCU), Dexter's underfill epoxy or any photo imageable coating material. With the MicroE extrusion coating equipment and the APS WCU epoxy, the equipment settings include POH rate 115 micro-liters (ul) per second, shuttle velocity 2.5 millimeter (mm), coating gap 125 um, and extrusion head shim of 0.2 mm.

With the extrusion coating process 80–90% of the coating material that is dispensed forms the layer of coating 1010, and a single dispense can produce the layer of coating 410 with the required thickness. In addition, the extrusion coating process can dispense the coating material having a desired thickness to a tolerance of 2%.

Figure 10D:
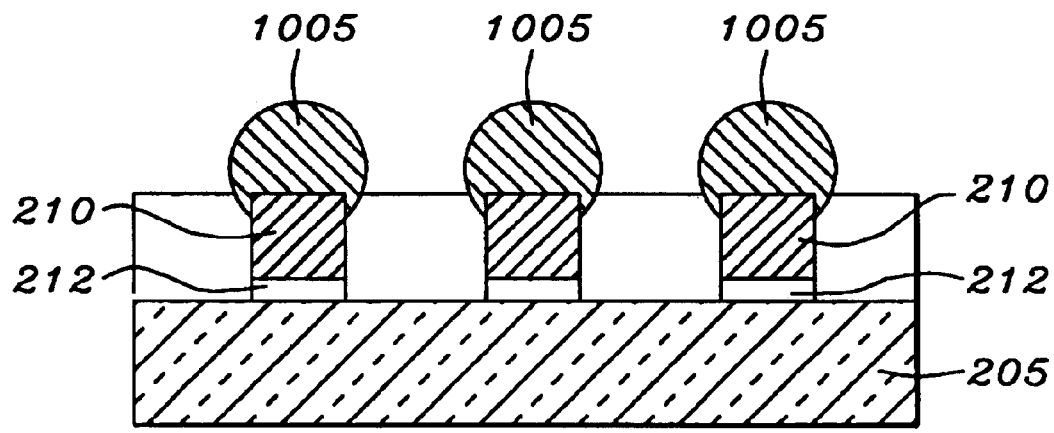
Figure 11:
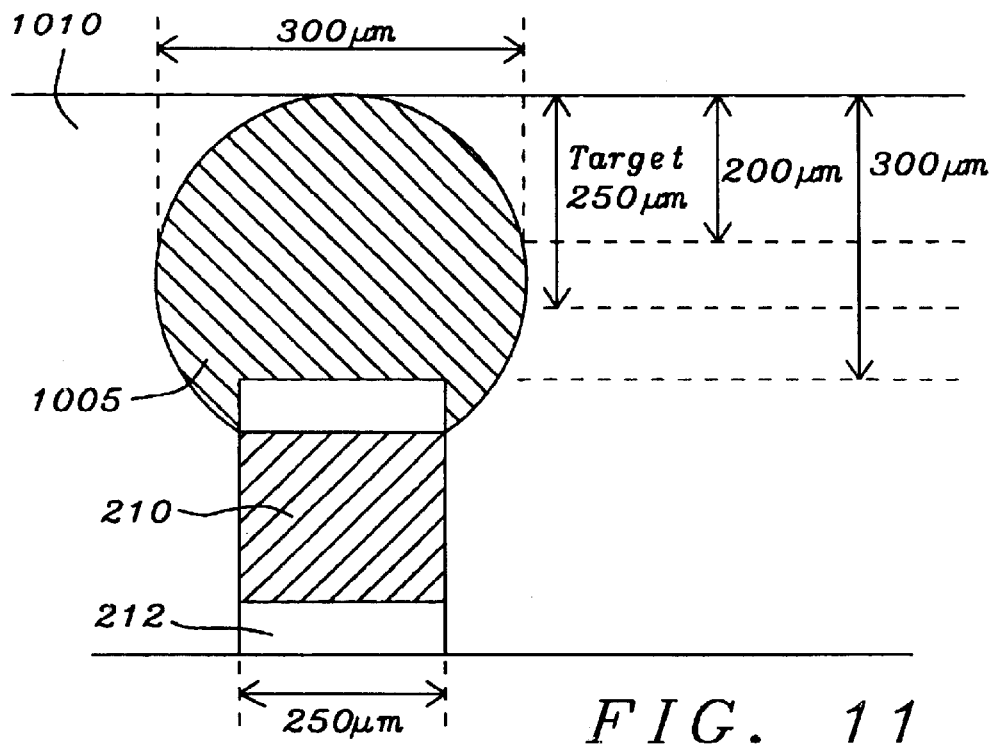
FIGS. 11–12 show enlarged cross-sectional views of a portion of the WL-CSP being formed in FIGS. 10C–D.

Subsequently, after the layer of coating material 1010 is cured, etchant is applied to the coated surface of the semiconductor wafer 205 to etch 930 away a portion of the cured layer of coating material 1010, to produce the etched semiconductor wafer 205, as shown in FIG. 10D. With reference to FIG. 11 for example, when the copper pillar 210 has a diameter of 250 microns, and the solder ball 1005 a diameter of 300 microns, then the target thickness for the etching process is set to 250 microns, when the etching process has a precision of 50 microns. Hence the thickness of the coating material 1010 that will be removed by etching will be between 200 and 300 microns. This means that the solder balls 1005 will either be completely exposed or partially exposed, but a sufficient portion of the solder ball 1005 is exposed to allow the solder ball 1005 to subsequently mount the WL-CSP, reliably.

Figure 12:
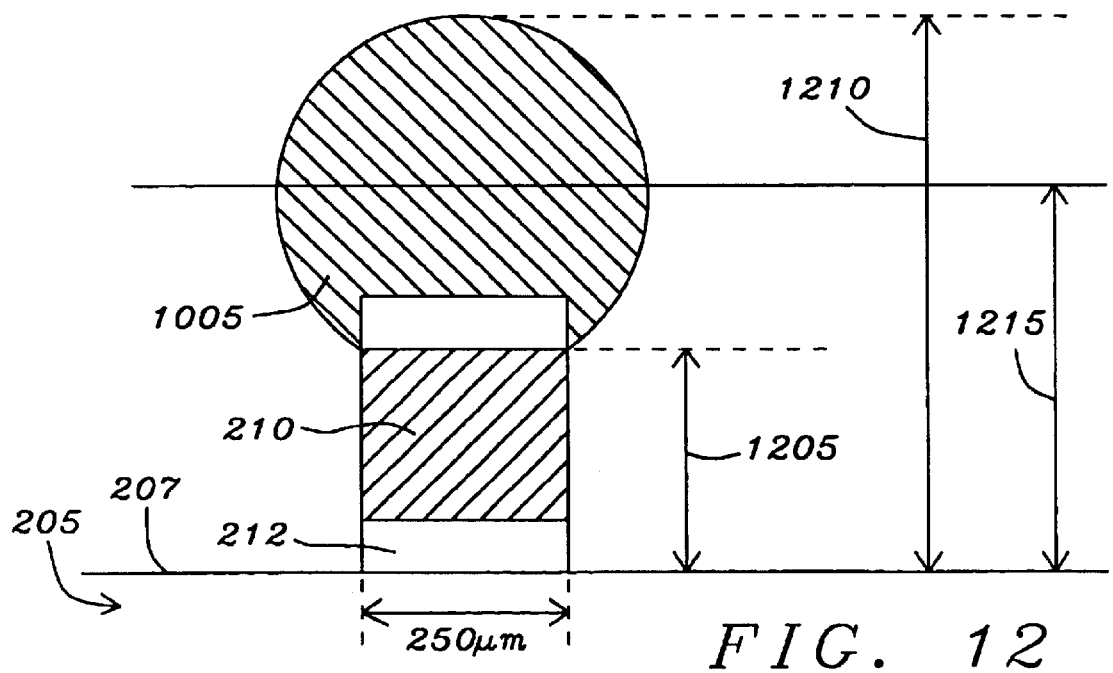

With reference to FIG. 12, height of the copper pillar 210 is a predetermined distance 1205 as measured from the surface 207 of the semiconductor die 205 to the top of the copper pillar 210. The thickness of the layer of coating material is another predetermined distance 1210, as measured from the surface 207 of the semiconductor die 205 to the top of the layer of coating material 1010. The thickness of the resultant layer of coating material 1010 after etching is a distance 1215, that is greater than the height of the copper pillar 210, as represented by the distance 1205, but less than the thickness of the layer of coating material, prior to etching, as represented by the distance 1210, as measured from the surface 207 of the semiconductor die 205.

When plasma etching is employed the plasma etchant comprises a gas composition of 5% $CF_4$, 90% $O_2$, 5% Ar, with a power setting of 400 watts for a duration of 15 minutes. After etching 930 the process 900 ends 935. The etching process may cause a layer of oxide to form on the surface of the solder balls 1005. A subsequent reflow step can then be performed to melt the solder balls 1005, to cause an oxide free surface to reform on the solder balls 1005.

Alternatively, deflashing equipment such as laser deflashers of media deflashers, that are typically used for leadframe and mold deflashing may be adapted and used to remove the portion of the cured layer of coating material 1010, to produce the etched semiconductor wafer 205, as shown in FIG. 10D. An example of a media deflasher is that manufactured by Fujiseiki of Japan.

Hence, the present invention, as described, advantageously forms a layer of coating material on a semiconductor wafer more quickly and with less wastage than the spin coating process, and with the required thickness using a single application. An additional advantage of the alternate embodiment of the present invention, as described, is that the joint between the solder ball and copper pillar is formed prior to application of the coating material. Consequently, contamination of the surfaces of the copper pillars, with or without a layer of gold, by the coating material is avoided.

A further advantage of the alternate embodiment is that the subsequent application of the coating material, after the joints between the solder balls and the copper pillars is formed, seals the joints within the layer of coating material, thereby improving the reliability of the WL-CSP.

The layer of coating 1010 can also be applied using known spin coating processes, however, the spin coating process must be controlled to produce the layer of coating 1010 having the predetermined thickness. For example, as mentioned before, the quantity of coating material that is disposed on the semiconductor wafer 205, the type of coating material used, and the speed and duration at which the semiconductor wafer 205 is spun, can be selected to produce the layer of coating material 1010 having the desired thickness. Another method for forming the layer of coating 1010 is by using a molding process in conjunction with a Teflon® film, similar to that taught in U.S. Pat. No. 5,891,384 assigned to Apic Yamada Corporation of Japan.

After applying the layer of coating material 1010, the semiconductor wafer 205 is heated to cure the layer of coating 1010. The heat is applied at a temperature of 350° C. for 45 to 60 minutes in a nitrogen (N2) environment. Typically, an oven with a controlled nitrogen chamber is used for curing.

Hence, the present invention, as described, produces a WL-CSP without subjecting the semiconductor wafer to mechanical grinding. In addition, the joint between the solder balls and the copper pillars is more reliable.

This is accomplished by forming an etch resistant conductive layer on pillar bumps on a semiconductor wafer, disposing a layer of coating material on the wafer with the bumps extending through and protruding from the surface of the layer of coating material. Subsequently, portions of the coating material on the top and the sides of the bumps are etched away, and solder balls attached to the exposed portion of the bumps.

In an alternate embodiment, the solder balls are attached to pillar bumps on a semiconductor wafer, and the bumps and the solder balls are encapsulated in a layer of coating material. Subsequently, a portion of the layer of coating material is etched away to substantially expose the solder balls.

Therefore, the present invention provides a method for forming a wafer level chip scale package and package formed thereby, which overcomes or at least reduces the above mentioned problems of the prior art.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed:

1. A method for forming a wafer level chip scale semiconductor package, the method comprising the steps of:
    a) providing a semiconductor wafer having a surface with a plurality of pads, wherein each of the pads has a conductor extending a first predetermined distance away from the surface;
    b) forming a layer of conductive etch resistant material on free ends of the conductors;
    c) disposing electrically insulating material on the surface of the semiconductor wafer, wherein the layer of electrically insulating material has an exposed surface a second predetermined distance from the surface of the semiconductor wafer, wherein the second predetermined distance is less than the first predetermined distance, and wherein portions of the electrically insulating material are disposed on the layer of conductive etch resistant material and on side surfaces of at least some of the conductors; and
    d) removing substantially all the portions of the electrically insulating material disposed on the layer of conductive etch resistant material and on the side surfaces of some of the conductors.

2. A method in accordance with claim 1 further comprising the steps of:
    e) disposing reflowable material on the conductive etch resistant layer on the free ends of the conductors; and
    f) reflowing the semiconductor wafer causing the reflowable material to adhere to the conductive etch resistant layer and at least some of the side surfaces of the conductors.

3. A method in accordance with claim 1 wherein step (b) comprises the step of depositing the conductive etch resistant material on the free ends of the conductors.

4. A method in accordance with claim 3 wherein step (b) comprises the step of depositing gold.

5. A method in accordance with claim 3 wherein step (b) comprises the step of depositing solder.

6. A method in accordance with claim 3 wherein step (b) comprises the step of depositing a layer of nickel, and subsequently depositing a layer of gold on the layer of nickel.

7. A method in accordance with claim 1 wherein step (b) comprises the step of plating etch resistant material on the free ends of the conductors.

8. A method in accordance with claim 1 wherein step (c) comprises the step of dispensing the electrically insulating material with an extrusion coating process.

9. A method in accordance with claim 1 wherein step (c) comprises a single extruding step.

10. A method in accordance with claim 1 wherein step (c) comprises the step of spin coating the layer of electrically insulating material on the surface of the semiconductor wafer.

11. A method in accordance with claim 10 wherein step (c) comprises the step of spin coating one of the coating materials from the group including underfill coating materials and photo imageable materials.

12. A method in accordance with claim 1 wherein step (c) comprises the step of molding the layer of electrically insulating material on the surface of the semiconductor wafer using release film.

13. A method in accordance with claim 1 wherein step (d) comprises the step of plasma etching.

14. A method in accordance with claim 1 wherein step (d) comprises the step of employing at least one laser for etching.

15. A method in accordance with claim 1 wherein step (d) comprises the step of employing a media deflasher for etching.

16. A method in accordance with claim 1 wherein step (e) comprises the step of printing deposits of solder.

17. A method in accordance with claim 1 further comprising, after step (c) and before step (d), the step of curing the electrically insulating material.

18. A method in accordance with claim 17, after step (c) and before the step of curing the electrically insulating material, comprising the step of cleaning the portions of the electrically insulating material disposed on the layer of conductive etch resistant material.

19. A method in accordance with claim 18 wherein the step of cleaning comprises the step of:
   applying release film on the layer of conductive etch resistant material; and
   removing the release film.

20. A method in accordance with claim 18 wherein the step of cleaning comprises the step of laser cleaning.

21. A method for forming a wafer level chip scale semiconductor package, the method comprising the steps of:
   (a) providing a semiconductor wafer having a surface with a plurality of pads, wherein each of the pads has a conductor extending a first predetermined distance away from the surface;
   (b) disposing reflowable material on free ends of the conductors;
   (c) disposing electrically insulating material on the surface of the semiconductor wafer, wherein the layer of electrically insulating material has an exposed surface a second predetermined distance from the surface of the semiconductor wafer, wherein the second predetermined distance is greater than the first predetermined distance; and
   (d) selectively removing at least a portion of the electrically insulating material such that the exposed surface is a third predetermined distance from the semiconductor wafer, wherein the third predetermined distance is greater than the first predetermined distance and less than the second predetermined distance.

22. A method in accordance with claim 21 further comprising the step of:
   (e) reflowing the semiconductor wafer causing the reflowable material to melt and reform a surface having reduced oxide thereon.

23. A method in accordance with claim 21 after step (a) and before step (b) comprising the step of depositing conductive etch resistant material on the free ends of the conductors, and wherein step (b) comprises the step of disposing reflowable material on the etch resistant material.

24. A method in accordance with claim 23 wherein the step of depositing conductive etch resistant material comprises the step of depositing gold.

25. A method in accordance with claim 21 after step (a) and before step (b) comprising the step of plating etch resistant material on the free ends of the conductors.

26. A method in accordance with claim 21 wherein step (b) comprises the step of printing deposits of reflowable material on the free ends of the conductors.

27. A method in accordance with claim 21 wherein step (b) comprises the step of printing solder on the free ends of the conductors.

28. A method in accordance with claim 21 wherein step (b) comprises the step of attaching solder balls to the free ends of the conductors.

29. A method in accordance with claim 21 after step (b) comprising the step of reflowing the semiconductor wafer.

30. A method in accordance with claim 21 wherein step (c) comprises the step of dispensing the electrically insulating material using an extrusion coating process.

31. A method in accordance with claim 21 wherein step (c) comprises a single dispensing step.

32. A method in accordance with claim 21 wherein step (c) comprises the step of spin coating the layer of electrically insulating material on the surface of the semiconductor wafer.

33. A method in accordance with claim 32 wherein step (c) comprises the step of spin coating a material selected from the group consisting of underfill coating materials and photo imageable materials.

34. A method in accordance with claim 21 wherein step (c) comprises the step of molding the layer of electrically insulating material on the surface of the semiconductor wafer using release film.

35. A method in accordance with claim 21 wherein step (d) comprises the step of plasma etching.

36. A method in accordance with claim 21 wherein step (d) comprises the step of employing at least one laser.

37. A method in accordance with claim 21 wherein step (d) comprises the step of employing a media deflasher.

38. A method in accordance with claim 21 further comprising, after step (c) and before step (d), the step of curing the electrically insulating material.

39. A method in accordance with claim 21, after step (b) and before step (d) comprising the step of cleaning the semiconductor wafer.

40. A method in accordance with claim 39 wherein the step of cleaning comprises the step of laser cleaning.

* * * * *